United States Patent
Soldano

(10) Patent No.: US 7,180,762 B2
(45) Date of Patent: Feb. 20, 2007

(54) CASCODED RECTIFIER

(75) Inventor: Marco Soldano, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/207,214

(22) Filed: Aug. 19, 2005

(65) Prior Publication Data

US 2006/0062032 A1 Mar. 23, 2006

Related U.S. Application Data

(60) Provisional application No. 60/603,589, filed on Aug. 23, 2004.

(51) Int. Cl.
*H02M 7/219* (2006.01)
(52) U.S. Cl. .......... 363/125; 363/84; 363/127; 327/376
(58) Field of Classification Search ........ 327/374–376, 327/427, 434, 436, 493, 581; 363/125, 44, 363/52, 53, 84, 127
See application file for complete search history.

(56) References Cited

U.S. PATENT DOCUMENTS

| | | | | |
|---|---|---|---|---|
| 4,473,757 A | * | 9/1984 | Farago et al. | 307/127 |
| 4,608,590 A | | 8/1986 | Hartman et al. | 357/38 |
| 5,422,563 A | * | 6/1995 | Pflueger | 323/312 |
| 6,323,718 B1 | * | 11/2001 | Rault et al. | 327/438 |
| 6,483,369 B1 | | 11/2002 | Wittenbreder, Jr. | 327/427 |

OTHER PUBLICATIONS

V. Khemka et al., "HMS Rectifier: A Novel Hybrid Mos Schottky Diode Concept with No Barrier Lowering, Low Leakage Current and High Breakdown Voltage," Proceedings of the 17th International Symposium on Power Semiconductor Devices & IC's, pp. 51-54, May 23-26, 2005, Santa Barbara, California.

* cited by examiner

*Primary Examiner*—Gary L Laxton
(74) *Attorney, Agent, or Firm*—Ostrolenk, Faber, Gerb & Soffen, LLP

(57) ABSTRACT

A high voltage rectifier device exhibiting low forward resistance and fast switching time formed of a high voltage structure connected in a cascode configuration with a low voltage structure. The high voltage structure is a bidirectional normally on semiconductor switch have two pairs of gate and source terminals which shuts off if either of the gate terminals is reverse biased. The low voltage structure is a diode, preferably a Schottky or barrier diode. The device is advantageously formed as an integrated circuit. With one of the terminal pairs of the switch clamped to zero volts, the device behaves as a diode, or the second terminal pair can be employed to provide the functions of a three terminal controlled rectifier. Among other possible applications are integrated circuits using four of the devices as a bridge rectifier, and as an anti-parallel diode for connection with an IGBT.

17 Claims, 2 Drawing Sheets

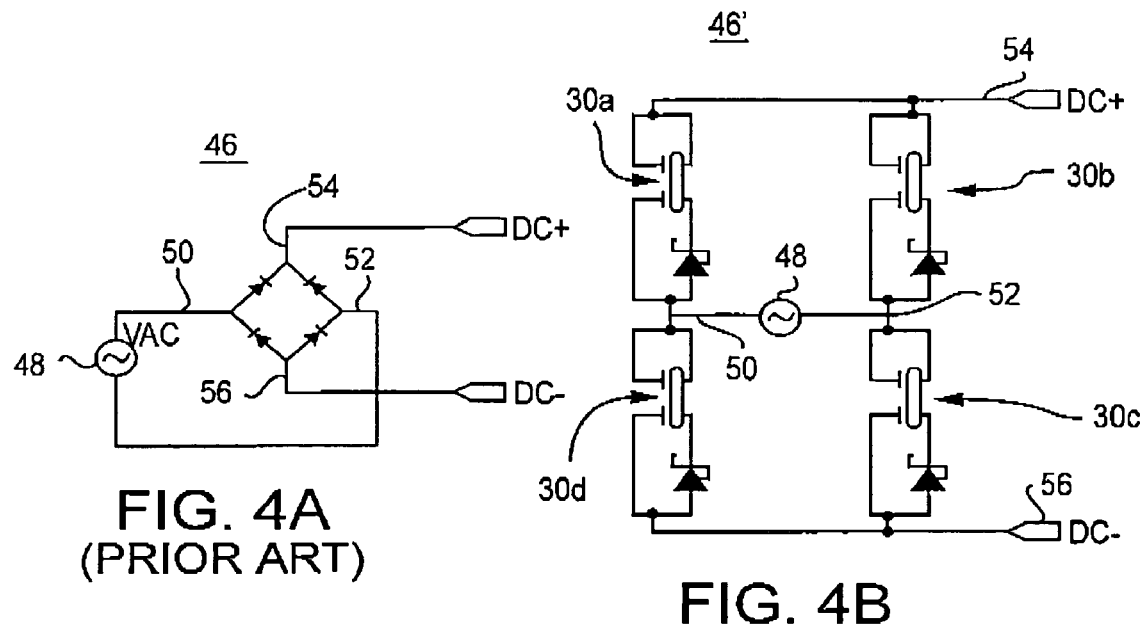
FIG. 4A
(PRIOR ART)
FIG. 4B
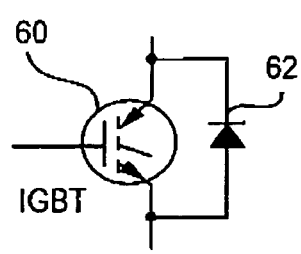
FIG. 5A
(PRIOR ART)
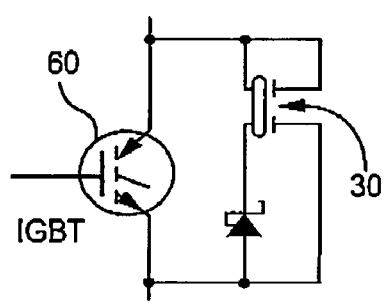
FIG. 5B

US 7,180,762 B2

CASCODED RECTIFIER

CROSS-REFERENCE TO RELATED APPLICATIONS

This application is based on and claims priority to U.S. Provisional Application No. 60/603,589, filed Aug. 23, 2004, the entire disclosure of which is incorporated herein by reference.

This application is also related to U.S. patent application Ser. No. 11/202,134, filed Aug. 11, 2005 in the name of Marco Soldano, entitled SELF-DRIVEN SYNCHRONOUS RECTIFIED BOOST CONVERTER WITH INRUSH CURRENT PROTECTION USING BIDIRECTIONAL NORMALLY ON DEVICE, the entire disclosure of which is also incorporated herein by reference.

BACKGROUND OF THE INVENTION

1. Technical Field of the Invention

The present invention relates to high voltage rectifier devices, and more particularly to such devices which exhibit significantly lower forward conduction and switching losses than conventional devices.

2. Relevant Art

Bipolar rectifiers are conventionally used for high voltage applications (e.g., above 200–300V). These rectifiers are typically realized with a p-i-n structure in order to provide an adequate reverse breakdown capability. However, the intrinsic region must exhibit high resistivity for the device to function properly. This results in a high voltage drop in the forward conduction mode, and in many high current applications, is the main source of power losses.

In some cases rectifiers can be replaced with switches controlled with dedicated control circuitry. These rectifiers are called synchronous rectifier circuits and offer the advantage of reducing forward conduction losses and to provide fast switching, but this requires use of active circuitry to detect the required status and operate the switch itself.

One approach which has been tried in an effort to reduce forward resistance in high voltage switches is illustrated in U.S. Pat. No. 6,483,369 for COMPOSITE MOSFET CASCODE SWITCHES FOR POWER CONVERTERS. In the patented device, a composite structure is formed of a large die size high voltage MOSFET arranged in cascode with a low voltage small die size MOSFET for the purpose of improving efficiency and switching speed. However, this approach suffers from the disadvantage that it requires additional control circuitry to perform synchronous rectifier function.

Accordingly, there is still a need for a simple, low loss, fast switching rectifier device for use at high voltages.

SUMMARY OF THE INVENTION

The present invention meets the above-stated need by providing a composite device including a normally on bidirectional switch connected in a cascode configuration with a low voltage diode such as a Schottky diode or the like. Preferably, the two parts are fabricated on a common substrate and encapsulated to form an IC with a minimum number of pins, for example, as few as 2 pins. Other components can be included in the IC to provide additional functionality.

Bidirectional switches of this kind are capable of conducting and blocking current in both directions. They are typically implemented using two control pins or gates to control current flow between two source terminals. The device is normally on: a negative bias must be applied between at least one of the respective gate-source pairs for the device to shut off. If one of the gates is reverse biased, there will be no current flow between the source terminals. A device of this type is shown, for example, in U.S. Pat. No. 4,608,590.

The low voltage diode is preferably connected between one of the gate-source pairs so that the composite device is self driven. The other gate-source pair can be held at zero volts by connecting the terminals together, or an external control signal can be used to provide a three terminal device which functions in the manner of and SCR (Silicon Controlled Rectifier) or Thyristor. Additionally, multiple devices can be combined: e.g., four of the devices can be fabricated as an IC to form a rectifier bridge, or one of the devices can be integrated with an insulated gate bipolar transistor (IGBT) in an antiparallel relationship to provide to provide freewheeling or reverse current protection function for the IGBT. Also, the above-mentioned related application Ser. No. 11/202,134 illustrates the use of the rectifier device in a high voltage boost converter. Other applications of the device will be readily apparent to those skilled in the art from the description which follows.

The invention provides significantly reduced conduction losses compared to conventional high voltage rectifiers, and at the same time, provides dramatically improved switching speed since no recovery current is present. The only reverse current will be the capacitive displacement current of the small Schottky rectifier, which is typically several order of magnitude smaller than in bipolar high voltage rectifiers.

It is accordingly an object of the present invention to provide a high voltage rectifier structure with very low forward conduction losses and fast switching time.

It is a further object of the invention to provide such a rectifier device which is formed of a low voltage diode and a bidirectional normally on switch connected in a cascode configuration.

It is another object of the invention to employ such a device in various circuit applications, including, but not limited to, a two terminal device that functions as a rectifier, a three terminal device that functions in the manner of an SCR or thyristor, a full-bridge rectifier, or in an anti-parallel configuration with an IGBT.

It is an additional object of the invention to provide such devices as integrated circuits.

Other features and advantages of the present invention will become apparent from the following description of the invention which refers to the accompanying drawings.

BRIEF DESCRIPTION OF THE DRAWING(S)

FIG. 4A illustrates a conventional full bridge rectifier topology, and FIG. 4B shows an implementation of the present invention to provide the functionality of the bridge rectifier of FIG. 4A.

FIG. 5A shows an IGBT with a conventional diode connected in an anti-parallel configuration between the emitter and collector terminals, and FIG. 5B shows the implementation of the circuit of FIG. 5A employing a rectifier device according to the present invention.

Throughout the drawings, like parts are designated by the same reference number.

DETAILED DESCRIPTION OF PREFERRED EMBODIMENTS OF THE INVENTION

Figure 1:
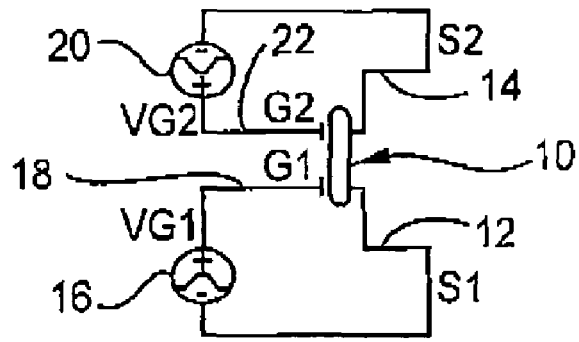
FIG. 1 illustrates a bidirectional normally on switch which may be used as a component of the devices according to this invention.

FIG. 1 illustrates a bidirectional normally conducting semiconductor switch which can be used as one of the components of the devices according to the present invention. The switch, generally designated at 10, is a known device which is capable of conducting and blocking current in both directions between a first source terminal 12 and a second source terminal 14. Control is provided by a bias voltage source 16 connected between a first gate terminal 18 and source terminal 12 and a second voltage source 30 connected between a second gate terminal 22 and source terminal 14. A device of this kind is characterized by the fact that when a negative bias below a programmed threshold is applied across either one or both of the gate-source pairs, the device will be off, i.e., will sustain a voltage between the source terminals. Only if the voltage at both gates is zero, can current flow between the two source terminals. Devices of this kind are commercially available from several sources as discrete elements, and IC fabrication techniques for manufacturing these devices are well known.

Figure 2:
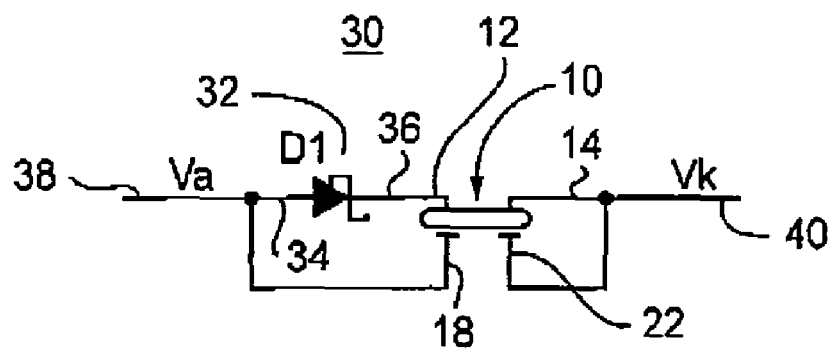
FIG. 2 shows an exemplary implementation of the invention to provide the function of a diode rectifier.

FIG. 2 shows how switch 10 of FIG. 1 can be used to form a high voltage rectifier. The illustrated device, generally denoted 30, includes switch 10, and a low voltage rectifier 32, such as a Schottky or barrier rectifier, having its anode 34 connected to gate terminal 18, and its cathode 36 connected to source terminal 12. Advantageously, switch 10 and diode 32 are fabricated on a common substrate, and encapsulated to form an integrated circuit with externally accessible "anode" and "cathode" terminals 38 and 40. To permit device 30 to function as a diode, source terminal 14 is directly connected to gate terminal 22, either by an external jumper, or by a direct internal connection.

In device 30, when the voltage $V_{AK}$ between the input terminal 38 and output terminal 40 is positive, current will flow in low voltage diode 32 and the bias voltage $V_{GS1}$ at gate terminal 18 will equal the forward voltage drop of diode 32. Since this will be a positive voltage, it will keep device 10 in the on state.

When $V_{AK}$ becomes negative, diode 32 will be reverse biased, and will develop a voltage equal or greater than the gate threshold for switch 10, which will then turn off and sustain the entire $V_{AK}$ voltage.

Figure 3:
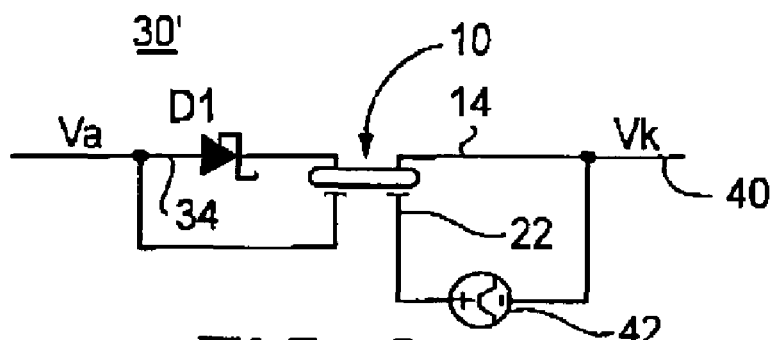
FIG. 3 shows an exemplary implementation of the invention to provide a three terminal controlled rectifier.

FIG. 3 illustrates how device 30 can be modified to provide a three-terminal controlled rectifier. Such a device, generally denoted at 30', utilizes the second gate-source pair 22-14 as a control to trigger the device on and off, so that the function of a Thyristor or SCR can be emulated but without the latching mechanism typical of these devices. In other words the switch can be enabled independently from the voltage applied to its power pins. Here, the direct connection between source 14 and gate 22 is replaced by an external control signal source, represented by a voltage source 42 which varies between zero and a suitable negative value. When the control signal voltage is zero, the state of switch 10 is determined only by $V_{AK}$. When the control signal voltage is negative, switch 10 shuts down, independent of $V_{AK}$. Device 30' therefore functions similar to an SCR or thyristor.

FIG. 4A shows at 46, a conventional full bridge rectifier circuit having an AC input 48 connected between terminals 50 and 52 and positive and negative DC output voltages provided at terminals 54 and 56. FIG. 4B illustrates the realization of such a bridge circuit 46' using rectifier devices 30a–30d of the kind illustrated in FIG. 2.

Here, the AC voltage source is connected to terminals 50 between rectifier devices 30a and 30d and to terminal 52 between rectifier devices 30b and 30c. The outputs 54 and 56 are respectively provided between rectifier devices 30a and 30b, and 30c and 30d. The configuration shown provides the functionality of a full bridge rectifier circuit with the high voltage, low conduction loss, and fast switching provided by rectifier device 30.

FIG. 5A illustrates a conventional IGBT 60 with a diode 62 connected in anti-parallel relationship. FIG. 5B illustrates the same circuit in which diode 62 is replaced by rectifier device 30.

Although the present invention has been described in relation to particular embodiments thereof, many other variations and modifications and other uses will become apparent to those skilled in the art. It is intended, therefore, that the invention not be limited not by the specific disclosure herein, but that it be given the full scope permitted according to the appended claims.

What is claimed is:

1. A switched high voltage rectifier device including:
   a low voltage structure comprised of a diode;
   a high voltage structure comprised of a bidirectional normally on semiconductor switch, wherein the high and low voltage structures are connected in a cascode conflauration wherein:
   a cathode terminal of the diode is connected to a first source terminal of the bidirectional switch;
   an anode terminal of the diode is connected to a first gate terminal of the bidirectional switch, and to a signal input terminal; and
   a second source terminal of the bidirectional switch is connected to a signal output terminal, and
   a coupling structure is provided between the second source terminal and a second gate terminal of the bidirectional switch.

2. A device according to claim 1, wherein the low and high voltage structures are fabricated on a common substrate and encapsulated to form an integrated circuit.

3. A device comprising four rectifier devices according to claim 1, constructed and configured to function as a full bridge rectifier.

4. A device according to claim 1, wherein the coupling structure is an externally controlled voltage source, whereby the device functions as a three terminal controlled rectifier.

5. A device according to claim 1, wherein the low voltage structure is a Schottky or a barrier diode.

6. A device according to claim 1, wherein the device is constructed and configured to function as a diode.

7. A device according to claim 1, wherein the device is constructed and configured to function as a three terminal controlled rectifier.

8. A device according to claim 1, wherein the coupling structure is a direct connection, whereby the device functions as a diode.

9. A bridge rectifier device comprising first, second, third, and fourth switched rectifier devices as described in claim 8, wherein:
   the input terminal of the first switched rectifier and the output terminal of the fourth switched rectifier are connected to a first bridge input terminal;

the input terminal of the second switched rectifier and the output terminal of the third switched rectifier are connected to a second bridge input terminal;

the output terminal of the first and second switched rectifiers are connected to a first bridge output terminal;

the input terminals of the third and fourth switched rectifiers are connected to a second bridge output terminal; and the bridge rectifier device is adapted to receive an AC input voltage at the bridge input terminals, and to provide a full wave rectified DC voltage at the bridge output terminals.

10. A bridge rectifier device according to claim 9, wherein the four rectifier devices are formed on a common substrate as part of a single integrated circuit.

11. A device according to claim 9, wherein the coupling structure is a direct connection, whereby the device functions as a diode.

12. A device according to claim 8, in combination with an IGBT, the IGBT having emitter and collector terminals thereof connected to the anode and cathode terminals of the rectifier device in an antiparallel relationship.

13. A combined device according to claim 12, wherein the rectifier device and the IGBT are formed on a common substrate as part of a single integrated circuit.

14. A bridge rectifier device comprising first, second, third, and fourth switched rectifier devices as described in claim 1, wherein:

an anode terminal of the first switched rectifier and a cathode terminal of the fourth switched rectifier are connected to a first bridge input terminal;

an anode terminal of the second switched rectifier and a cathode terminal of the third switched rectifier are connected to a second bridge input terminal;

cathode terminals of the first and second switched rectifiers are connected to a first bridge output terminal;

anode terminals of the third and fourth switched rectifiers are connected to a second bridge output terminal; and the bridge rectifier device is adapted to receive an AC input voltage at the bridge input terminals, and to provide a full wave rectified DC voltage at the bridge output terminals.

15. A bridge rectifier device according to claim 14, wherein the four rectifier devices are formed on a common substrate as part of a single integrated circuit.

16. A circuit comprising a switched high voltage rectifier device including:

a low voltane structure comprised of a diode;

a high voltage structure comprised of a bidirectional normally on semiconductor switch, wherein the high and low voltage structures are connected in a cascode configuration:

further comprising an IGBT, the IGBT having emitter and collector terminals thereof connected to anode and cathode terminals of the rectifier device in an antiparallel relationship.

17. A circuit according to claim 16, wherein the rectifier device and the IGBT are formed on a common substrate as part of a single integrated circuit.

* * * * *